United States Patent
Watanabe et al.

(10) Patent No.: US 7,312,468 B2
(45) Date of Patent: Dec. 25, 2007

(54) SEMICONDUCTOR LIGHT-EMITTING ELEMENT AND METHOD OF MANUFACTURING THE SAME

(75) Inventors: Atushi Watanabe, Tsurugashima (JP); Atsuya Ito, Tsurugashima (JP); Hirokazu Takahashi, Tsurugashima (JP); Yoshinori Kimura, Tsurugashima (JP); Mamoru Miyachi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 147 days.

(21) Appl. No.: 10/535,175

(22) PCT Filed: Nov. 12, 2003

(86) PCT No.: PCT/JP03/14366

§ 371 (c)(1),
(2), (4) Date: May 17, 2005

(87) PCT Pub. No.: WO2004/047245

PCT Pub. Date: Jun. 3, 2004

(65) Prior Publication Data

US 2006/0027814 A1  Feb. 9, 2006

(30) Foreign Application Priority Data

Nov. 18, 2002 (JP) ............................. 2002-233168

(51) Int. Cl.
*H01L 29/06* (2006.01)
*H01L 31/072* (2006.01)
*H01L 31/109* (2006.01)
*H01L 31/0328* (2006.01)
*H01L 31/0336* (2006.01)
*H01L 33/00* (2006.01)

(52) U.S. Cl. ........................................ 257/14; 257/103
(58) Field of Classification Search .......... 257/88–103, 257/12–18
See application file for complete search history.

(56) References Cited

U.S. PATENT DOCUMENTS

| | | | |
|---|---|---|---|
| 6,649,942 B2 * | 11/2003 | Hata et al. ................... 257/103 |
| 6,665,329 B1 * | 12/2003 | Crawford et al. ............ 257/103 |
| 6,806,502 B2 * | 10/2004 | Iyechika et al. .............. 257/79 |
| 6,833,564 B2 * | 12/2004 | Shen et al. ................... 257/94 |
| 6,835,962 B2 * | 12/2004 | Udagawa ...................... 257/97 |
| 2002/0008242 A1 | 1/2002 | Hata |
| 2002/0053676 A1 | 5/2002 | Kozaki |

* cited by examiner

*Primary Examiner*—Cuong Nguyen
(74) *Attorney, Agent, or Firm*—Sughrue Mion Pllc.

(57) ABSTRACT

The semiconductor light-emitting element uses a compound semiconductor quantum well structure comprising a well layer, and barrier layers between which the well layer is sandwiched, as an active layer. In the adjacent well layer and barrier layers of the semiconductor light-emitting element, the well layer has in part a doped well region to which an n-type impurity is added at the interface with the barrier layer on the electron injection side, and in the vicinity of this interface, and the barrier layer has a doped barrier region to which the n-type impurity is added at least at the interface and in the vicinity of this interface.

23 Claims, 5 Drawing Sheets

SEMICONDUCTOR LIGHT-EMITTING ELEMENT AND METHOD OF MANUFACTURING THE SAME

TECHNICAL FIELD

The present invention relates to a semiconductor light-emitting element.

BACKGROUND ART

As light-emitting elements that is capable of emitting light in a range from visible light into ultraviolet light, there is developed semiconductor light-emitting elements such as light-emitting diodes, semiconductor laser diodes and the like using single crystals of group III nitride semiconductors $(Al_xGa_{1-x})_{1-y}In_yN$ ($0=x=1$, $0<y=1$).

Semiconductor laser elements have been realized in which a quantum well layer formed by sandwiching a semiconductor layer that has a small band gap and a film thickness of a few nanometers between two semiconductor layers having larger band gaps is used as a light-emitting layer. Semiconductor laser elements which allow a low threshold value operation by using a modulated doped structure as the active layer of a multiple quantum well (MQW) structure have also been proposed.

Conventionally, in InGaN based semiconductor lasers, the doping of the InGaN-MQW that acts as the active layer with impurities such as Si or the like has been uniformly performed in the barrier layers alone or well layers alone or in both types of layers (for example, see Re-published Patent WO98/19375). Alternatively, MQW in which the active layer is not doped, i.e., undoped MQW (that are not intentionally doped with impurities), have also been proposed (for example, see Japanese Patent Application Laid-Open No. 2001-7444).

In the past, even in semiconductor light-emitting elements with a quantum well structure, the operating current density has been high, and characteristics sufficient for practical use have not been obtained. Accordingly, there is a demand for a semiconductor light-emitting element which has a low operating current density, and which is suitable for continuous oscillation.

DISCLOSURE OF INVENTION

Accordingly, the provision of a semiconductor light-emitting element which has a low threshold current density may be cited as one of the problems to be solved by the present invention.

The semiconductor light-emitting element of the present invention is a semiconductor light-emitting element composed of at least compound semiconductors comprising an active layer consisting of a quantum well structure including a well layer and barrier layers between which said well layer is sandwiched, wherein said well layer has in part a doped well region to which an n-type impurity is added at the interface with said barrier layer on an electron injection side and in the vicinity of said interface, and wherein said barrier layer has a doped barrier region to which said n-type impurity is added at least at said interface and in the vicinity of said interface.

The semiconductor light emitting element manufacturing method of the present invention is a method for manufacturing a semiconductor light-emitting element composed of at least compound semiconductors including an active layer consisting of a quantum well structure having a well layer and barrier layers between which said well layer is sandwiched, said method comprising the steps of: growing a barrier layer while adding an n-type impurity so that a doped barrier region to which said n-type impurity is added is formed to the uppermost surface; and growing a well layer on said uppermost surface of the barrier layer while adding said n-type impurity to form a doped well region to which said n-type impurity is added on said uppermost surface servicing as an interface with said barrier layers on the electron injection side.

DETAILED DESCRIPTION OF THE INVENTION

The semiconductor light-emitting element of the present invention will be described below in terms of embodiments with reference to the drawings attached hereto.

Figure 1:
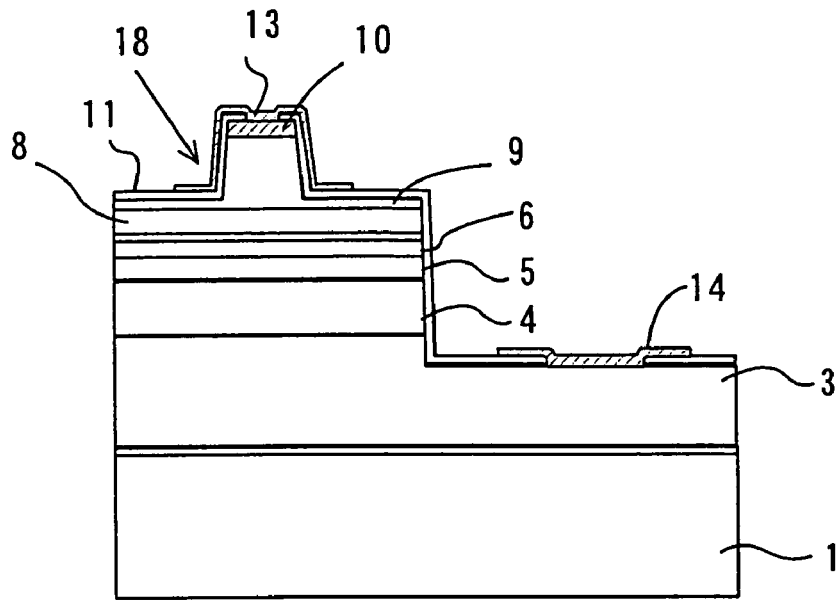
FIG. 1 is a schematic sectional view which shows a semiconductor laser element with a multiple quantum well structure of an embodiment according to the present invention.

FIG. 1 shows a group III nitride semiconductor laser element of one embodiment. This semiconductor laser element comprises: an n-type contact layer 3; an n-type cladding layer 4; an n-type guide layer 5; an active layer 6 with a quantum well structure consisting of one or a plurality of pairs of well layers and barrier layers whose major constituent elements are In, Ga and N; a p-type guide layer 8; a p-type cladding layer 9; and a p-type contact layer 10 which are laminated in that order on a single-crystal sapphire substrate 1. Here an n-type electrode 14 and a p-type electrode 13 of the semiconductor laser element are respectively connected to the n-type contact layer 3 and p-type contact layer 10. In other words, this semiconductor laser element is composed of p-type and n-type carrier injection layer groups which are positioned above and below the active layer with the quantum well structure made of at least group III nitride, and which inject holes and electrons into the active layer respectively. Each of the two carrier injection layer groups comprises the guide layer, the cladding layer and the contact layer which are disposed in the order on either side of the active layer. A ridge stripe part 18 is formed in the p-type cladding layer 9, and the element is covered and protected by a $SiO_2$ insulating film 11 except for the electrodes. The n-type and p-type cladding layers 4 and 9 are formed to have refractive indexes lower than those of the n-type and p-type guide layers 5 and 8, so that generated light-waves are guided in the direction of the film thickness by virtue of the difference in refractive index with the guide layers. The ridge stripe part 18 generates a horizontal step in the effective refractive index by varying the film thickness of the cladding layer 9, and is provided in order to confine the generated light in the horizontal direction. The n-type contact layer 3 is an underlayer provided as a current path. The layer 3 is provided since sapphire serving as the substrate does not have any electric conductivity at all. Furthermore, in a semiconductor laser element, a so-called buffer layer made of GaN or AlN formed at a low temperature may also be disposed between the n-type contact layer 3 and the sapphire substrate 1. Furthermore, an electron barrier layer made of p-type AlGaN may also be disposed between the active layer 6 and the p-type guide layer 8, in particular, to further enhance the confinement of electrons.

Figure 2:
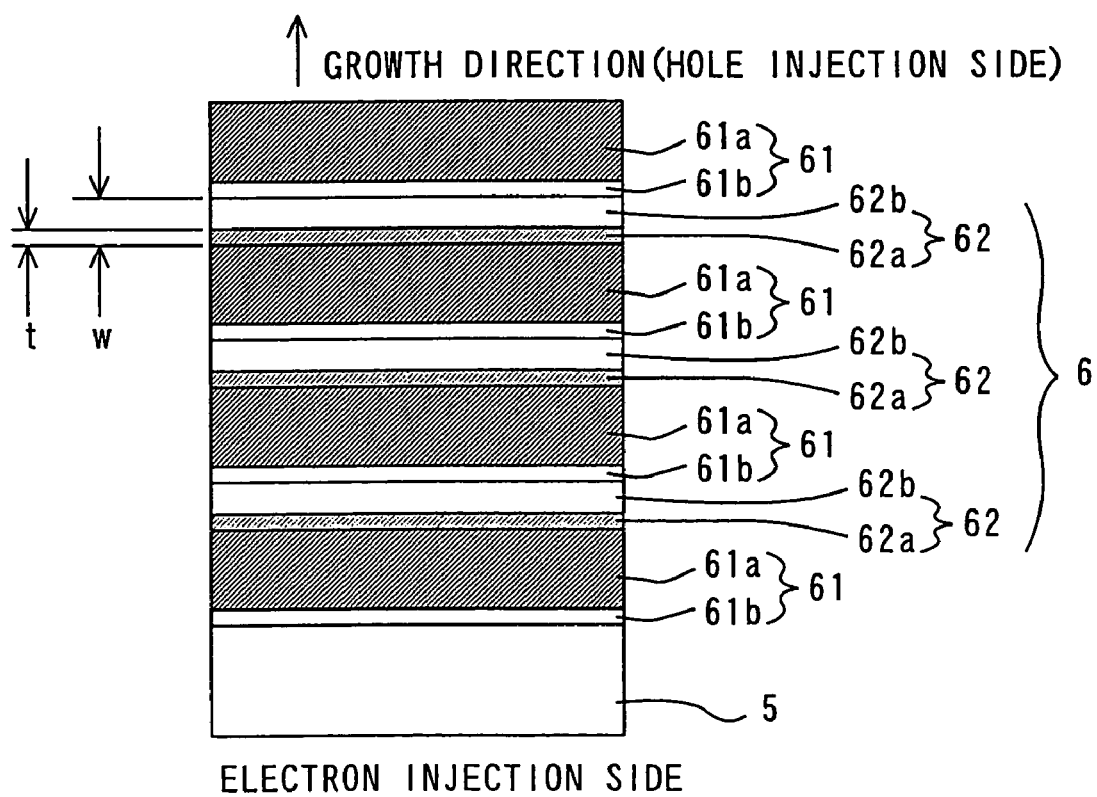
FIG. 2 is a schematic enlarged sectional view which shows the active layer in a semiconductor laser element with a multiple quantum layer structure of an embodiment according to the present invention.

As is shown in FIG. 2, the active layer 6 of the group III nitride semiconductor laser element has a compound semiconductor quantum well structure comprising well layers 62 each partially doped with Si, and adjacent Si-doped barrier layers 61 which are layered alternately. The well layers 62 and barrier layers 61 are formed through the successive epitaxial growths of a plurality of single-crystal films each mainly made of a group III nitride $B_{x'}Al_xGa_yIn_zN$ ($x'+x+y+z=1$).

In cases where a voltage is applied across the n-type electrode 14 and p-type electrode 13 so that electrons are injected into the active layer 6 from the n-type guide layer 5, the injected electrons are collected mainly in the well layers 62. This is because the active layer consists of well layers 62 that have a high In content (i.e., a small band gap) and barrier layers 61 that have a low In content (i.e., a large band gap). The holes injected from the p-type guide layer 8 recombine with the electrons injected from the n-type guide layer 5 so that light is generated. The generated light is limited by the guide layers, cladding layers and ridge. The light is confined into the inside area between the pair of cladding layers, and is guided in the direction parallel to the ridge, so that this light is emitted from the end surface of the laser element.

As is shown in FIG. 2, each well layer 62 partially has a doped well region 62a to which an n-type impurity is added at the interface with the barrier layer 61 on the electron injection side and in the vicinity of this interface. Further each barrier layer 61 has a doped barrier region 61a to which an n-type impurity is added, at least at the interface and in the vicinity of this interface.

The doped well region 62a to which an n-type impurity is added and the doped barrier region 61a to which an n-type impurity is added residing in the each adjacent set of well layer 62 and barrier layer 61 improve the light emission characteristics of the group III nitride semiconductor laser element.

As is shown in FIG. 2, where t is the film thickness of each doped well region 62a and w is the film thickness of each well layer 62, it is desirable that the thickness value is in the range of 0<t<(w/2). It is desirable that each barrier layer 61 have an undoped barrier region 61b to which no n-type impurity is added at the interface on the position hole injection side of the well layer 62, and in the vicinity of this interface. Furthermore, it is desirable that each well layer 62 have an undoped well region 62b to which no n-type impurity is added at the interface on the hole injection side of the well layer 62, and in the vicinity of this interface. Moreover, in the case that an n-type Group III compound semiconductor layer is formed, a Group IV or Group VI element such as Si, Ge, Se, Te or C can be used as an n-type impurity and a desirable n-type impurity is Si or Ge. A portion of Group III elements of the Group III nitride compound semiconductor boron (B) may be replaced with thallium (Tl). Besides sapphire, the substrate may be formed of silicon (Si), silicon carbide (SiC), spinel ($MgAl_2O_4$), ZnO, MgO, etc.

The crystalline structure of the semiconductor layer including the active layer in the present invention is a wurtzite structure, and the principal plane of the element is the so-called C plane. A wurtzite structure does not show mirror image symmetry with respect to the direction of the C axis, so that two (front and back) polarities, i.e., a (0001) plane and a (000-1) plane exist in the so-called C plane. Corresponding to this, a <0001> direction and a <000-1> direction also exist in the epitaxial growth direction. In the embodiments of the present invention, the epitaxial growth direction is the <0001> direction. The reason for this is that it has been experimentally demonstrated that the light-emitting properties of crystal layers grown in the <0001> direction are superior to those of crystal layers grown in the <000-1> direction.

Ordinarily, in cases where so-called modulated doping is performed, uniform doping is performed in the well layers or barrier layers. On the other hand, the inventors discovered that the light-emitting characteristics of the element can be improved by deliberately shifting the doping position while performing doping mainly in the barrier layers. Below, this technique of deliberately shifting the doping position will be called "offset doping", and an offset toward the hole injection side will be called "positive (+)", while an offset toward the electron injection side will be called "negative (−)". Furthermore, in cases where simply the term "offset" or "offset amount" is used below, this will indicate the offset or offset amount of the doped portion or region, i.e., the portion or region to which an n-type impurity such as Si or the like is added.

The method of the present invention for manufacturing a semiconductor light-emitting element which has an active layer mainly made of a group III nitride will be described in detail below.

Here, in the element of the present embodiment, an epitaxial growth of metal organic chemical vapor deposition (MOCVD) is used as the film formation method. Furthermore, the semiconductor light-emitting element can also be manufactured using a molecular beam epitaxy (MBE) method by which a steep hetero-interface can be formed.

An underlying wafer on which a GaN film with a film thickness of 15 μm has been formed beforehand as an n-type contact layer on a sapphire substrate is mounted in an MOCVD reactor, and elevation of the temperature is initiated in a hydrogen carrier gas at a pressure of 300 Torr. When the substrate temperature reaches 400° C., ammonia ($NH_3$) for a nitrogen source is introduced into the reactor, and the temperature elevation is continued.

When the substrate temperature reaches 1050° C., trimethylgallium (hereinafter abbreviated as TMG) for a Ga precursor, trimethylaluminum (hereinafter abbreviated as TMA) for an Al precursor and methylsilane so-called $MeSiH_3$ for a Si precursor are introduced into the reactor, and an n-type cladding layer consisting of Si-doped AlGaN is grown to a film thickness of 1.2 μm on the surface of the n-type contact layer (n-type cladding layer formation process). When the target thickness of the n-type cladding layer is reached, only the supply of TMA is stopped.

Next, the supply of TMG and methylsilane is continued so that an n-type guide layer consisting of Si-doped GaN is grown to a film thickness of 0.05 μm on the surface of the n-type cladding layer (n-type guide layer formation process). When the target thickness of the n-type guide layer is reached, the supply of TMG and methylsilane is stopped, and a temperature drop is initiated.

Next, when the substrate temperature reaches 780° C., the carrier gas is changed from hydrogen to nitrogen. Subsequently, TMG and a first trimethylindium (hereinafter abbreviated as TMI) for an In precursor are introduced, and a barrier layer consisting of undoped InGaN is grown to a film thickness of 10 angstroms on the surface of the n-type guide layer (undoped barrier layer formation process).

Next, methylsilane is introduced, and a doped barrier region (Si-doped region) consisting of Si-doped InGaN is grown to a film thickness of 50 angstroms on top of the undoped barrier region (undoped portion) (Si-doped barrier layer formation process).

Next, the supply of the first TMI is stopped, and a second TMI is supplied instead, so that a doped well region (Si doped portion) consisting of Si-doped InGaN is grown to a film thickness of 10 angstroms on top of the doped barrier region (Si doped portion) (Si-doped well layer formation process). Here, the only difference between the first TMI and the second TMI is the flow rate. A well layer of $In_xGa_{1-x}N$ ($0<x<1$) and a barrier layer of $In_yGa_{1-y}N$ ($0=y<x$), i.e., both layers with different solid phase compositions, are formed according to this difference in flow rate.

Next, the supply of methylsilane is stopped, and a well layer (undoped portion) is grown to a film thickness of 20 angstroms on top of the doped well region (Si-doped portion) (undoped well layer formation process).

Next, the supply of the second TMI is stopped, and the first TMI is supplied instead, so that the process is repeated from the above-mentioned undoped barrier layer formation process. For example, the process extending from the undoped barrier layer formation process to the undoped well layer formation process is repeated a total of three times. Then the final barrier layer (consisting of the undoped portion and the Si-doped portion) is formed, thus obtaining an MQW active layer of three well layers by the offset doping. The concentration of Si atoms in the crystal in each doping region is preferably 8E17 to 1E19/cc, and is even more preferably 1E18 to 7E18/cc. The flow rate of methylsilane in the above-mentioned process is adjusted so that the concentration of Si atoms in the final crystal is in the above-mentioned range.

Next, when the film thickness of the final barrier layer reaches a total of 60 angstroms, the supply of the first TMI and methylsilane is stopped, and TMA and bis-ethylcyclopentadienyl magnesium $\{Mg(C_2H_5C_5H_4)_2$ hereinafter abbreviated as EtCp2Mg$\}$, which is a Mg precursor, are introduced instead, so that an electron barrier layer consisting of Mg-doped AlGaN is grown to a film thickness of 200 angstroms on top of the active layer (electron barrier layer formation process).

Next, the carrier gas is changed from nitrogen to hydrogen, and a temperature elevation is initiated. When the substrate temperature reaches 1050° C., TMG and EtCp2Mg are introduced, and a p-type guide layer consisting of Mg-doped GaN is grown to a film thickness of 0.05 μm on top of the electron barrier layer (p-type guide layer formation process).

Next, TMA is introduced, and a p-type cladding layer consisting of Mg-doped AlGaN is grown to a film thickness of 0.5 μm on top of the p-type guide layer (p-type cladding layer formation process).

Next, only the supply of TMA is stopped, and a p-type contact layer consisting of Mg-doped GaN is grown to a film thickness of 0.1 μm on top of the p-type cladding layer (p-type contact layer formation process).

Next, the supply of TMG and EtCp2Mg is stopped, and a temperature drop is initiated. When the substrate temperature reaches 400° C. or less, the supply of ammonia is stopped. When the substrate temperature reaches room temperature, the wafer on which the semiconductor laser structure has been laminated is removed from the MOCVD apparatus.

Afterward, current paths are demarcated by partially exposing then-type contact layer by an ordinary photolithographic process and dry etching. Furthermore, a ridge stripe part consisting of the p-type contact layer and p-type cladding layer is formed, and an insulating film consisting of $SiO_2$ or the like is deposited on the exposed surface. Next, windows used for the formation of electrodes are patterned in this insulating film. Then, an n-type electrode and p-type electrode consisting of titanium and nickel or the like are respectively connected to the n-type contact layer and p-type contact layer.

Afterward, the sapphire substrate side on the back surface is polished to a specified wafer thickness, and the wafer is split by cleaving so that chips are formed.

Through the above-mentioned way, a laser element with a ridge width of 5 μm and a resonator length of 1 mm was manufactured, and this laser element was subjected to a driving test. As a result, it was found that this laser element showed a laser oscillation at a wavelength of 405 nm and a threshold current density of 4.3 $kA/cm^2$. For purposes of comparison, a conventional laser element in which uniform doping was performed only in the barrier layers without any offset was also manufactured, and was subjected to a driving test. As a result, the threshold current density was 7.8 $kA/cm^2$.

Separately from the comparison of the above-mentioned laser elements, various PL (photoluminescence) evaluation samples were manufactured in order to compare only the active layers, and measurements were performed on these samples. The above-mentioned samples were basically samples in which growth was halted at the uppermost barrier layer of the above-mentioned laser structure. Such samples will be referred to as MQW samples below.

The first MQW sample had the same construction as the active layer portion of the above-mentioned laser element in the above-mentioned embodiment. This sample was manufactured as follows: the introduction of the first TMI and the introduction of methylsilane were not simultaneously performed in the undoped barrier layer formation process and well layer formation process, so that there was a time difference in the offset (corresponding to a film thickness of t for the doped well region equal to ⅓ of the well layer film thickness w). Furthermore, in the barrier layer formation process, the supply of the first TMI was stopped, and the supply of methylsilane was continued even after the second TMI was introduced, and after a specified offset time difference (corresponding to a film thickness of t for the doped well region equal to ⅓ of the well layer film thickness w) had elapsed, the supply of methylsilane was stopped. This MQW sample will be referred to as sample D.

Furthermore, comparative samples were manufactured as described below, and a comparative test of the light-emitting characteristics was conducted using the PL method.

As Comparative Example A, a so-called undoped MQW sample was manufactured by the same process as in the case of sample D, except that methylsilane was not introduced during the growth of the active layer in the manufacturing process of sample D.

As Comparative Example B, a so-called barrier uniformly doped MQW sample was manufactured by the same process as in the case of sample D, except that methylsilane was not introduced during the growth of the well layers in the manufacturing process of sample D, and methylsilane was introduced during the growth of the barrier layers.

As Comparative Example C, a so-called well uniformly doped MQW sample was manufactured by the same process as in the case of sample D, except that methylsilane was not introduced during the growth of the barrier layers in the manufacturing process of sample D, and methylsilane was introduced during the growth of the well layers. Furthermore, the actual amount of offset was confirmed by SIMS (secondary ion mass spectroscopy analysis). In cases where methylsilane was introduced only during the growth of the barrier layers, the variations in the In profile and Si profile which serve as indicators for the well layers and barrier layers were completely matched in reverse phases. On the other hand, in cases where offset doping was performed, it was confirmed that the amount of offset corresponded to the supply timing of the precursor gases by the amounts of shift in the In profile and Si profile in SIMS analysis.

Figure 3:
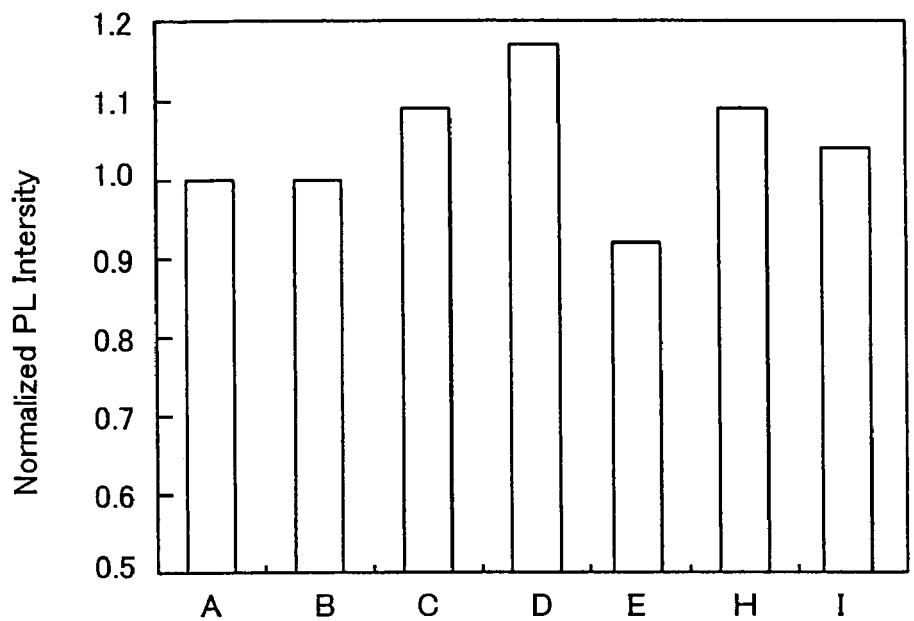
FIG. 3 is a graph showing the PL intensities of samples of the multiple quantum well structure in the present invention and comparative examples.
Figure 4:
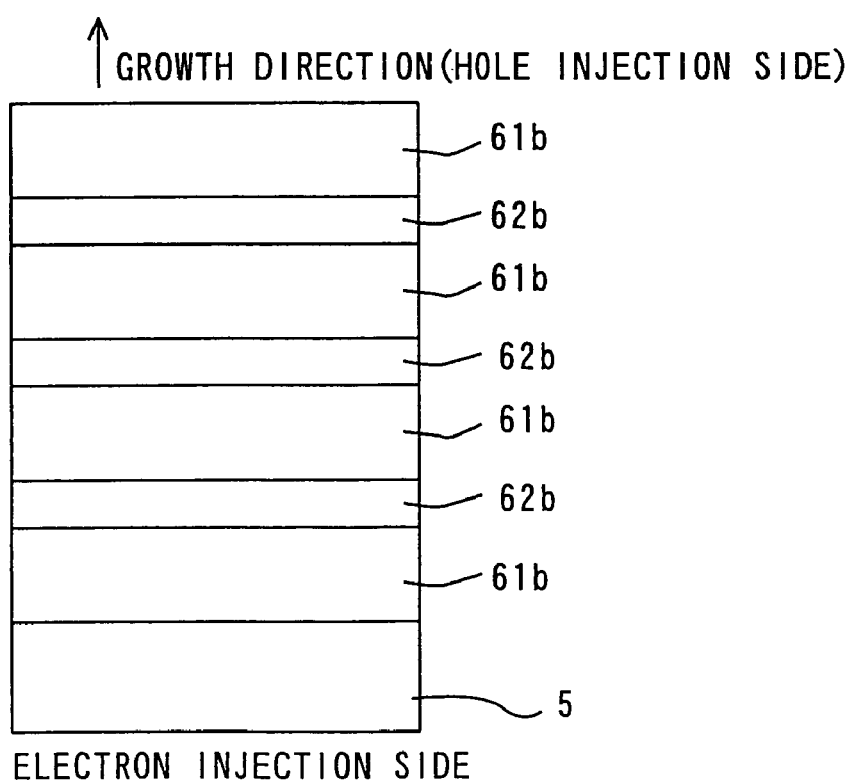
FIGS. 4 through 9 are schematic enlarged sectional views showing the active layers in samples of the multiple quantum well structure used in experiments.
Figure 5:
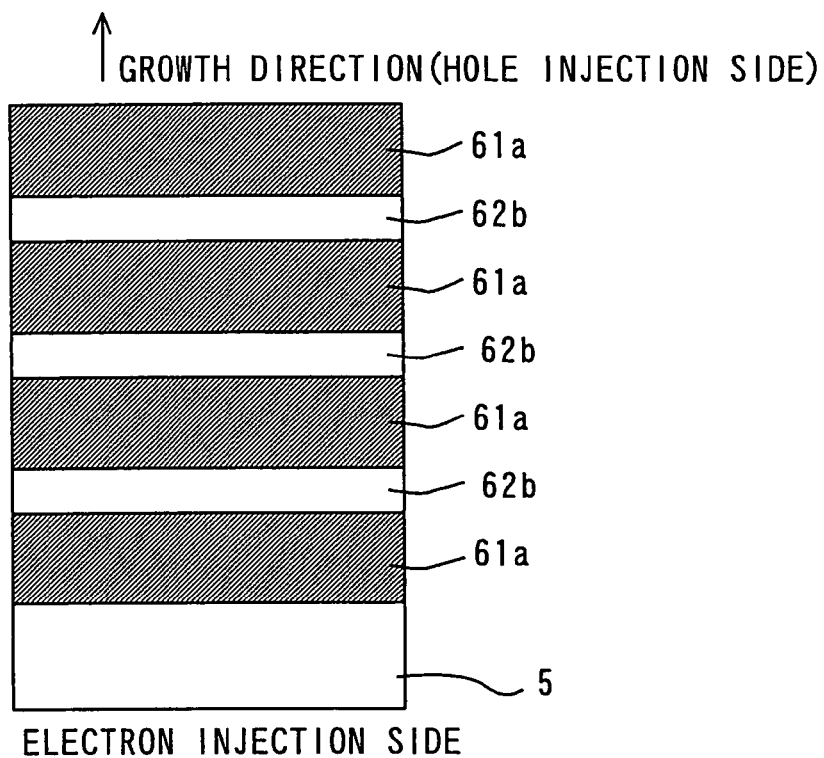
Figure 6:
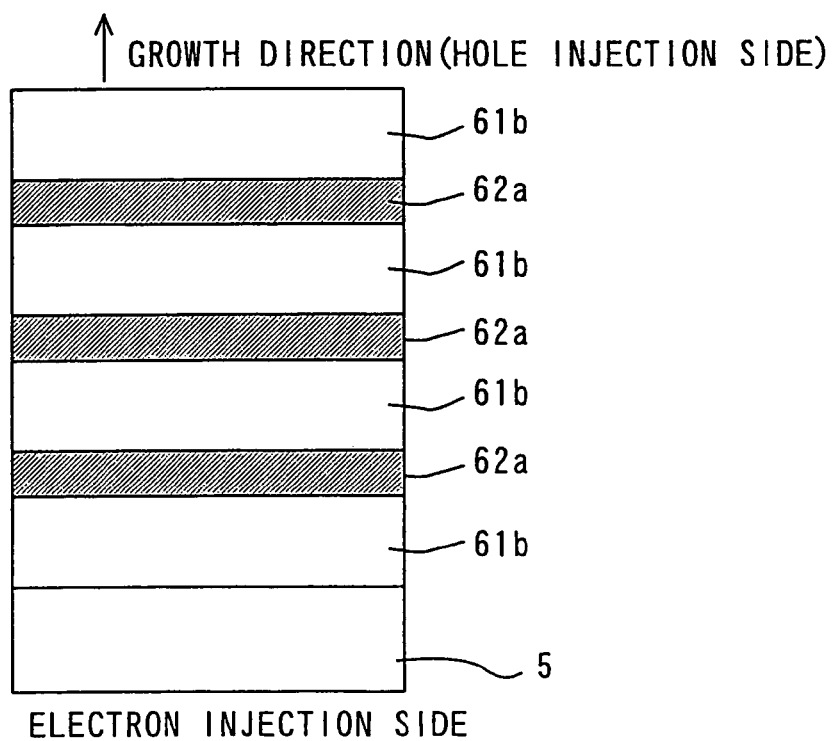
Figure 7:
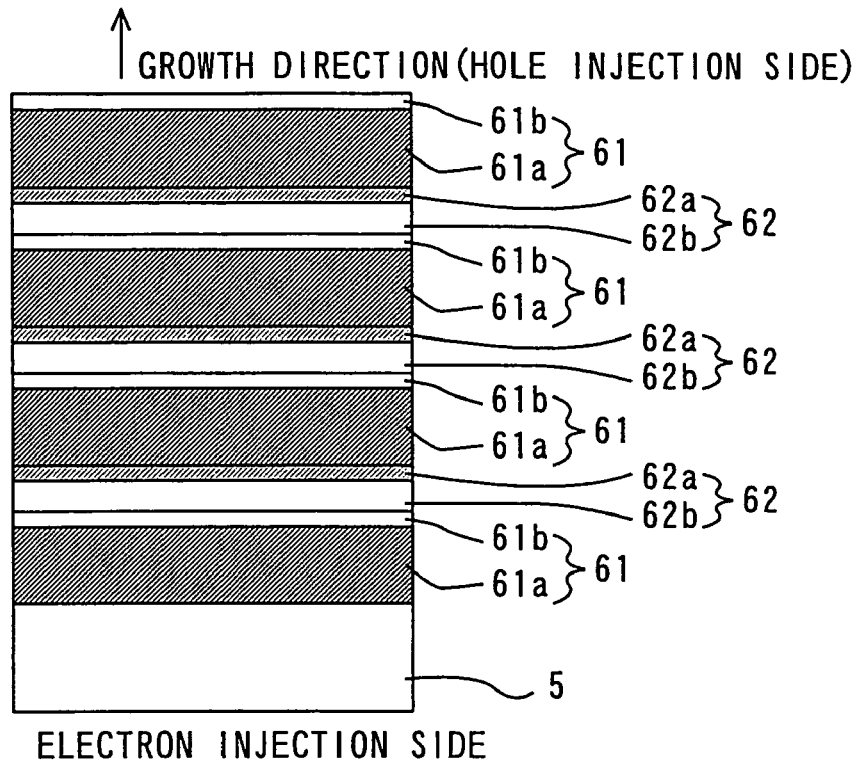
Figure 8:
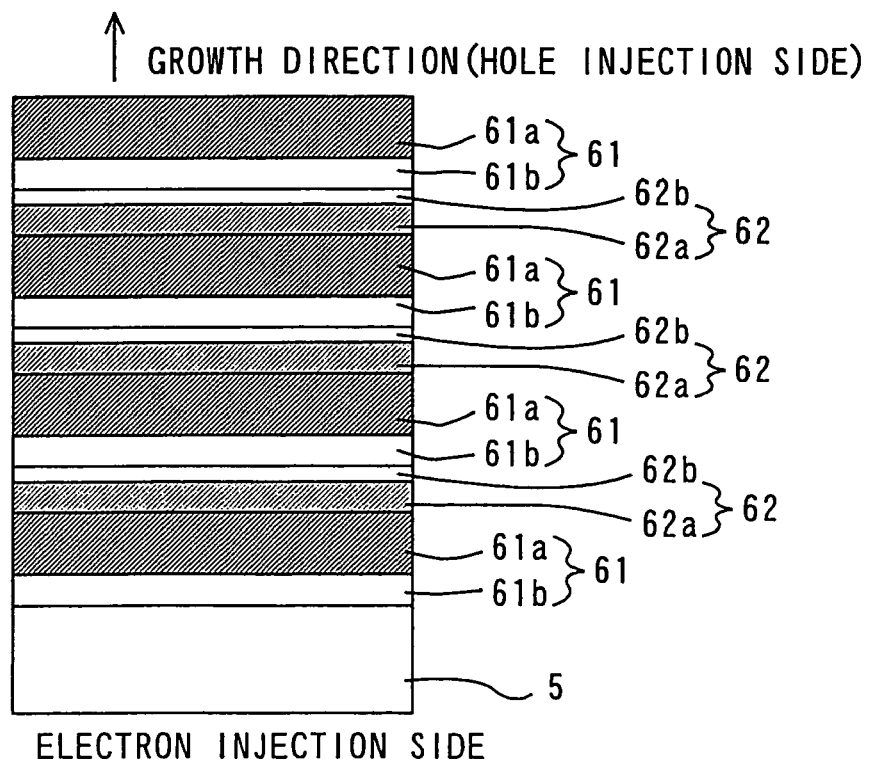
Figure 9:
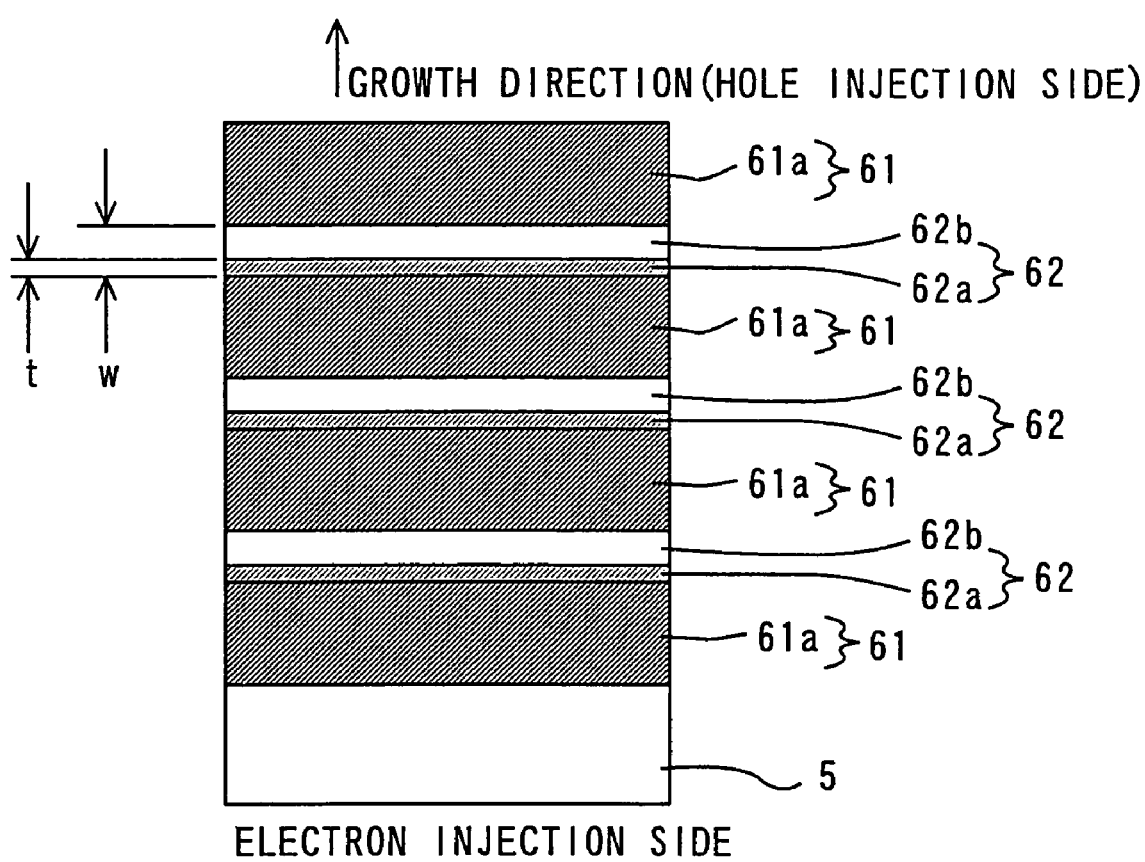

Tests of the light-emitting characteristics were performed for sample D and the comparative examples. The results obtained are shown in FIG. 3. The evaluation of the light-emitting characteristics was performed by the PL (photoluminescence) method in which the MQW was excited by irradiating the surface of the sample with nitrogen laser light, and measuring the emitted light. The figure shows a relative comparison of the light emission intensities in PL. Among Comparative Examples A, B and C, Comparative Example C shows only a slightly higher light emission intensity. However, sample D, in which offset doping was performed, shows an even higher light emission intensity than these comparative examples, and was thus found to show good light-emitting characteristics.

Furthermore, since it was found in the above-mentioned experiment that the light-emitting characteristics were improved by sample D using offset doping, various MQW samples were prepared in which the direction and amount of offset were varied.

As sample E, an MQW sample with so-called reverse offset doping was manufactured by the same process as the manufacturing process of sample D, except that a Si-doped portion was formed with an offset straddling the interfaces of the well layers with the barrier layers on the hole injection side. In the case of sample E, the introduction of the first TMI and the introduction of methylsilane were not performed simultaneously in the undoped barrier layer formation process and well layer formation process, and the sample was manufactured with an offset time difference (corresponding to −⅓ the thickness of the well layers) provided.

As sample H, an MQW sample with so-called offset doping was manufactured by the same process as the manufacturing process of sample D, except that the Si-doped portions were formed with an increased amount of offset straddling the interfaces of the well layers with the barrier layers on the electron injection side. In this case, the amount of offset corresponded to ⅔ of the well layer thickness.

As sample I, an MQW sample with so-called one-sided offset doping was manufactured by the same process as the manufacturing process of sample D, except that the Si-doped portions were formed with an offset straddling the interfaces of the well layers with the barrier layers on the electron injection side, and all of the barrier layers were doped with Si.

Sectional model diagrams of the Comparative Examples A, B and C and samples E, H and I thus manufactured are respectively shown in FIGS. 4, 5, 6, 7, 8 and 9.

Tests of light-emitting characteristics were performed on sample D and the comparative examples. The results obtained are also shown in FIG. 3. In regard to the amount of offset, as is clear from the figure, since the relative order for the samples and comparative examples is B<I<H<D, the amount of offset is highest in the case of the sample D. The sample E with reverse offset shows a drop in intensity even with respect to Comparative Example B, it is seen that the direction of the offset is important, and further that it is desirable that every well layer has a doped well region to which an n-type impurity is added residing in part at each interface with the barrier layer on the electron injection side, and in the vicinity of the interface, and that the barrier layers have the doped barrier regions to each of which an n-type impurity is added existing at least at the interfaces on the hole injection side and in the vicinity of these interfaces respectively.

Furthermore, as a result of the comparison of the results obtained for sample I and the results obtained for sample D, it is seen that the similar provision of regions that are not doped in the barrier layers (undoped barrier regions 61b at the interfaces of the well layers 62 on the hole injection side and in the vicinity of these interfaces) in addition to the provision of an offset in the well layers increases the effect. Accordingly, it is desirable that the film thickness of the barrier undoped layer 61b of the barrier layer 61 is equal to or less than the film thickness of the doped well region 62a. It is seen from the results obtained for samples D and I that it is desirable that the film thickness t of the doped well region 62a is in the range of $0<t<(w/2)$, where w is the film thickness of the well layers 62.

In the above-mentioned embodiments, a case was described in which the present invention was applied to a semiconductor laser element. However, a similar effect can also be obtained when the present invention is applied to a light-emitting diode, and a light-emitting diode with a high brightness (high efficiency) can be manufactured. In the above-mentioned embodiments, a multiple quantum well (MQW) structure was described for a light-emitting layer. However, the active layer may also be formed with a single quantum well (SQW) structure.

The invention claimed is:

1. A semiconductor light-emitting element composed of at least compound semiconductors comprising an active layer consisting of a quantum well structure including a well layer and barrier layers between which said well layer is sandwiched, wherein said well layer has in part a doped well region to which an n-type impurity is added at the interface with said barrier layer on an electron injection side and in the vicinity of said interface, and wherein said barrier layer has a doped barrier region to which said n-type impurity is added at least at said interface and in the vicinity of said interface.

2. The semiconductor light-emitting element according to claim 1, wherein the film thickness t of said doped well region is in the range of $0<t<(w/2)$, where w is the film thickness of said well layer.

3. The semiconductor light-emitting element according to claim 1 or 2, wherein said barrier layer has an undoped barrier region to which, said n-type impurity is not added at the interface with said well layer on the hole injection side, and in the vicinity of said interface.

4. The semiconductor light-emitting element according to claim 3, wherein the film thickness of said undoped barrier region of said barrier layer is equal to or less than the film thickness of said doped well region.

5. The semiconductor light-emitting element according to claim 1 or 2, wherein said doped barrier region spreads throughout said entire barrier layer.

6. The semiconductor light-emitting element according to claim 1 or 2, wherein the crystalline structure of said active layer is a wurtzite structure, and the principal plane of said active layer is the (0001) plane.

7. The semiconductor light-emitting element according to claim 1 or 2, wherein said compound semiconductor consists mainly of a group III nitride $B_{x'}Al_xGa_yIn_zN$ (x'+x+y+z=1).

8. The semiconductor light-emitting element according to claim 1 or 2, wherein said n-type impurity is Si or Ge.

9. The semiconductor light-emitting element according to claim 1 or 2, wherein the concentrations of the n-type impurity in said doped well region and said doped barrier region are 8E17/cc to 1E19/cc respectively.

10. The semiconductor light-emitting element according to claim 3, wherein the crystalline structure of said active layer is a wurtzite structure, and the principal plane of said active layer is the (0001) plane.

11. The semiconductor light-emitting element according to claim 5, wherein the crystalline structure of said active layer is a wurtzite structure, and the principal plane of said active layer is the (0001) plane.

12. The semiconductor light-emitting element according to claim 3, wherein said compound semiconductor consists mainly of a group III nitride $B_{x'}Al_xGa_yIn_zN$ (x'+x+y+z=1).

13. The semiconductor light-emitting element according to claim 5, wherein said compound semiconductor consists mainly of a group III nitride $B_{x'}Al_xGa_yIn_zN$ (x'+x+y+z=1).

14. The semiconductor light-emitting element according to claim 6, wherein said compound semiconductor consists mainly of a group III nitride $B_{x'}Al_xGa_yIn_zN$ (x'+x+y+z=1).

15. The semiconductor light-emitting element according to claim 3, wherein said n-type impurity is Si or Ge.

16. The semiconductor light-emitting element according to claim 5, wherein said n-type impurity is Si or Ge.

17. The semiconductor light-emitting element according to claim 6, wherein said n-type impurity is Si or Ge.

18. The semiconductor light-emitting element according to claim 7, wherein said n-type impurity is Si or Ge.

19. The semiconductor light-emitting element according to claim 3, wherein the concentrations of the n-type impurity in said doped well region and said doped barrier region are 8E17/cc to 1E19/cc respectively.

20. The semiconductor light-emitting element according to claim 5, wherein the concentrations of the n-type impurity in said doped well region and said doped barrier region are 8E17/cc to 1E19/cc respectively.

21. The semiconductor light-emitting element according to claim 6, wherein the concentrations of the n-type impurity in said doped well region and said doped barrier region are 8E17/cc to 1E19/cc respectively.

22. The semiconductor light-emitting element according to claim 7, wherein the concentrations of the n-type impurity in said doped well region and said doped barrier region are 8E17/cc to 1E19/cc respectively.

23. The semiconductor light-emitting element according to claim 8, wherein the concentrations of the n-type impurity in said doped well region and said doped barrier region are 8E17/cc to 1E19/cc respectively.

* * * * *